United States Patent
Kuang

(10) Patent No.: US 7,244,633 B1
(45) Date of Patent: Jul. 17, 2007

(54) CHIP CARRIER SUBSTRATE WITH A LAND GRID ARRAY AND EXTERNAL BOND TERMINALS

(75) Inventor: Raymond Kuang, Fremont, CA (US)

(73) Assignee: Actel Corporation, Mountain View, CA (US)

( * ) Notice: Subject to any disclaimer, the term of this patent is extended or adjusted under 35 U.S.C. 154(b) by 98 days.

(21) Appl. No.: 11/128,682

(22) Filed: May 13, 2005

Related U.S. Application Data

(62) Division of application No. 10/724,530, filed on Nov. 26, 2003, now Pat. No. 6,946,726.

(51) Int. Cl.
*H01L 21/44* (2006.01)
(52) U.S. Cl. .............. 438/107; 257/E23.067
(58) Field of Classification Search .......... 438/6, 438/10, 107–114, 104, 118, 121–123, 128–129, 438/135, 142, 145, 149, 151, 157, 176, 478, 438/184, 193, 195–198, 200–207, 209–211, 438/218, 237, 165, 248, 168, 343, 294, 308
See application file for complete search history.

(56) References Cited

U.S. PATENT DOCUMENTS

| | | | |
|---|---|---|---|
| 6,461,895 B1 * | 10/2002 | Liang et al. ............... 438/107 |
| 6,747,352 B1 | 6/2004 | Huemoeller et al. ........ 257/738 |
| 7,045,897 B2 * | 5/2006 | Egitto et al. ............... 257/759 |
| 2002/0145203 A1 * | 10/2002 | Adae-Amoakoh et al. .. 257/778 |
| 2002/0173070 A1 * | 11/2002 | Bolken et al. ............. 438/106 |
| 2003/0164543 A1 * | 9/2003 | Kheng Lee ................ 257/706 |
| 2006/0022303 A1 * | 2/2006 | Desai et al. ............... 257/532 |

\* cited by examiner

*Primary Examiner*—Walter Lindsay, Jr.
*Assistant Examiner*—Andre' Stevenson
(74) *Attorney, Agent, or Firm*—Sierra Patent Group, Ltd.

(57) ABSTRACT

A carrier for a semiconductor die has a substrate with a cavity formed in the substrate. The cavity has a bottom and sidewalls, and the sidewalls have a stepped tier. Electrically conductive contacts are disposed on an underside of the substrate. Electrically conductive tabs are disposed on the stepped tier, and electrically conductive external bond terminals are disposed on an edge of the substrate. Electrically conductive paths are formed in the substrate and electrically coupled between the electrically conductive tabs, the electrically conductive contacts, and the electrically conductive external bond terminals.

6 Claims, 3 Drawing Sheets

CHIP CARRIER SUBSTRATE WITH A LAND GRID ARRAY AND EXTERNAL BOND TERMINALS

CROSS-REFERENCE TO RELATED APPLICATION

This application is a divisional of co-pending U.S. patent application Ser. No. 10/724,530, filed Nov. 26, 2003 now U.S. Pat. No. 6,946,726, the entirety of which is incorporated by reference herein.

BACKGROUND OF THE INVENTION

1. Field of the Invention

The present invention relates to a semiconductor die carrier. More particularly, the present invention relates to a semiconductor die carrier with a land grid array of metal pads employed to provide testing and operating signals to a semiconductor die disposed in the semiconductor die carrier.

2. The Background Art

The process of testing programming a semiconductor die to ensure that the circuits formed in the die are operating properly is referred to as Known Good Die. It is known in the art, that bond pads formed on the bare silicon of the semiconductor die may be used to test the semiconductor die during the Known Good Die process, and in the case of a programmable logic device (PLD), to program the semiconductor die during a programming process. PLDs are well known to those of ordinary skill in the art, and typically include uncommitted groups of digital logic, which may be programmed to form higher digital logic functions, and uncommitted routing channels, which may be programmed to connect together the programmed digital logic. An example of a PLD is a field programmable gate array (FPGA). A PLD may be programmed and tested by either the manufacturer of the PLD or by a purchaser of the PLD.

The pitch or distance between the bonds pads on the semiconductor die has tended to decrease as the geometry of the transistors used in the manufacturing process, often complementary metal oxide silicon (CMOS), has been reduced. The migration to smaller processes has been occurring for some time in the semiconductor arts and is expected to continue. One of the problems associated with the decreased pitch between bond pads is that it makes the testing and programming of a semiconductor more difficult. Generally, it has been found that once the bond pad pitch drops below 85 um, testing and programming are no longer very feasible, nor reliable.

One solution to this problem is to package the semiconductor die in a die carrier, test and program the semiconductor die through a land grid array of metal pads disposed on an underside of the die carrier, and then use the die carrier as a typical IC component by attaching or reflowing the die carrier to a printed circuit board (PCB) by the metal pads on the underside of the die carrier. Semiconductor die carriers are well known to those of ordinary skill in the art. They are typically employed to protect the semiconductor die or device from mechanical, thermal and environmental stress. They also provide input and output from the semiconductor device, and are often used in multi-chip modules, wherein a number of carriers or dies are attached to a substrate, such as a PCB, a thick/thin film ceramic, or silicon with an interconnection pattern. Semiconductor die carriers are ubiquitously found in the multi-chip modules that populate consumer, commercial, military and space electronics. They add significantly to the reliability and function of these applications.

FIG. 1 illustrates schematically in cross-section an example of a semiconductor die carrier according to the prior art. The die carrier 10 has a substrate 12 formed from ceramic or other substrate materials well known to those of ordinary skill in the art. Within an opening in the die carrier 10, a semiconductor die 14 is disposed on the substrate 12. On the underside of the substrate 12 is a land grid array of metal pads 16. As is well known in the art, the metal pads 16 are typically arranged in a rectangular array. The number of metal pads 16 and the space in between the metal pads depends on several things, including the size of the semiconductor die and the number of inputs and outputs that are required.

The die carrier 10 may be adhered by the metal pads 16 of the land grid array to a substrate such as a PCB by any of several known methods well known to those of ordinary skill in the art, such as with an epoxy or by growing or attaching a solder ball or column that is then reflowed to the substrate to which the die carrier is being attached. A sealing lid 18 covers the opening in which the semiconductor die 14 is disposed in the substrate 12, and is adhered around the top of the opening by one of several mechanisms well known to those of ordinary skill in the art. The sealing lid 18 protects the semiconductor die from mechanical, thermal and environmental distress.

An electrical connection is made from the semiconductor die 14 by a metal wire 20 to an electrically conductive tab 22 disposed on a tier 24. The electrically conductive tab 22 is coupled to one of the plurality of metal pads 16 in the land grid array by an electrically conductive path 26 in the substrate 12. It should be appreciated that the metal wire 20, the electrically conductive tab 22, and the electrically conductive path 26 represent a plurality of metal wires, a plurality of electrically conductive tabs, and a plurality of electrically conductive paths, respectively.

During the Known Good Die process, the testing of the semiconductor die 14 in the die carrier 10 may need to be performed several times. This may pose a problem, because the metal pads 16 can become damaged during the process. As a consequence, operating signals provided to the semiconductor device 14 during a normal operating mode through the metal pads 16 in the die carrier 10 may be corrupted. This would make the semiconductor device unsuitable for interconnection of to other devices. In the specific case of PLDs, this may be a very significant problem, because PLDs are both programmed and tested, so that the metal pads 16 of the die carrier 10 may be subject to even greater damage.

BRIEF DESCRIPTION OF THE INVENTION

A carrier for a semiconductor die has a substrate with a cavity formed in the substrate. The cavity has a bottom and sidewalls, and the sidewalls have a stepped tier with a plurality of electrically conductive tabs disposed on the stepped tier. A plurality of wires are electrically coupled between the semiconductor die and the plurality of electrically conductive tabs. A plurality of electrically conductive contacts are disposed on an underside of the substrate, and a plurality of electrically conductive external bond terminals are disposed on either on a portion of an outside edge of the substrate or on a ledge in a recess formed in the edge of the substrate. A plurality of electrically conductive paths formed from conductive vias and conductive lines are formed in the substrate and are electrically coupled between the electrically conductive tabs, the electrically conductive contacts, and the electrically conductive external bond terminals.

DETAILED DESCRIPTION OF A PREFERRED EMBODIMENT

Figure 1:
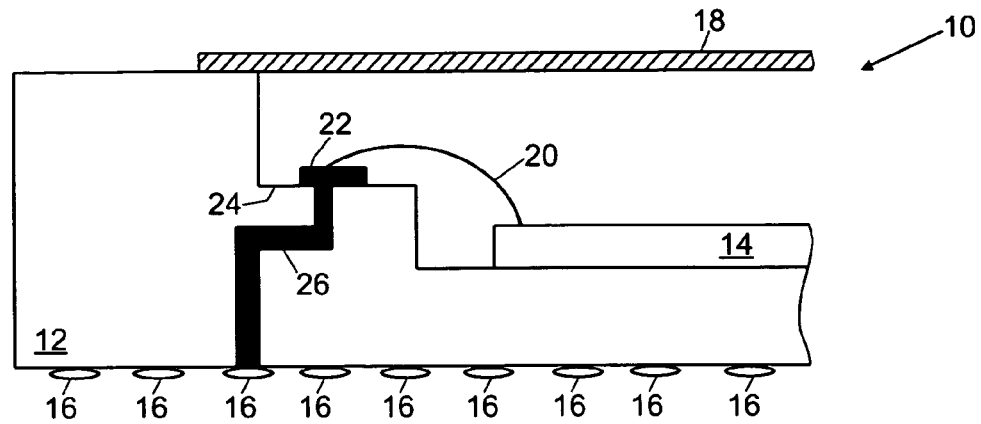
FIG. 1 is a cross section of a prior art semiconductor die carrier.

Those of ordinary skill in the art will realize that the following description of the present invention is illustrative only and not in any way limiting. Other embodiments of the invention will readily suggest themselves to such skilled persons.

According to a first aspect of the present invention, a carrier for a semiconductor die has a substrate formed from a multilayer of ceramic substrates, laminates of organic dielectrics, or from deposited thin film layers. A cavity formed in the substrate, the cavity has a bottom and sidewalls, and the sidewalls have a stepped tier with a plurality of electrically conductive tabs disposed on the stepped tier. A plurality of wires are electrically coupled between the semiconductor die and the plurality of electrically conductive tabs. A sealing lid is disposed on the substrate and covers the cavity. A plurality of electrically conductive contacts are disposed on an underside of the substrate, and a plurality of electrically conductive external bond terminals are disposed on either on a portion of an outside edge of the substrate or on a ledge in a recess formed in the edge of the substrate. A plurality of electrically conductive paths formed from conductive vias and conductive lines are formed in the substrate and are electrically coupled between the electrically conductive tabs, the electrically conductive contacts, and the electrically conductive external bond terminals.

According to a second aspect of the present invention, a carrier for a semiconductor die has a substrate formed from a multilayer of ceramic substrates, laminates of organic dielectrics, or from deposited thin film layers. A plurality of electrically conductive surface contacts are disposed on the upper surface of the substrate, and the semiconductor die has a plurality of semiconductor die contacts electrically connected to the plurality of electrically conductive surface contacts.

A cover is disposed on the substrate and covers the semiconductor die. A plurality of electrically conductive contacts are disposed on an underside of the substrate, and a plurality of electrically conductive external bond terminals are disposed on either on a portion of an outside edge of the substrate or on a ledge in a recess formed in the edge of the substrate. A plurality of electrically conductive paths formed from conductive vias and conductive lines are formed in the substrate and are electrically coupled between the electrically conductive surface contacts, the electrically conductive contacts, and the electrically conductive external bond terminals.

According to a third aspect of the present invention, a method for using a semiconductor die carrier with a plurality of electrically conductive metal contacts and a plurality of electrically conductive external bond terminals includes the steps of testing a semiconductor die through the plurality of electrically conductive metal contacts, and operating the semiconductor die in a normal operating mode through the electrically conductive external bond terminals.

According to a fourth aspect of the present invention, a method for using a semiconductor die carrier with a plurality of electrically conductive metal contacts and a plurality of electrically conductive external bond terminals includes the steps of testing the semiconductor die through the plurality of electrically conductive metal contacts, examining the plurality of electrically conductive metal contacts to determine if the electrically conductive metal contacts are damaged and operating the semiconductor die in a normal operating mode through the electrically conductive external bond terminals when the electrically conductive metal contacts are damaged.

According to a fifth aspect of the present invention, a method for forming a substrate for a semiconductor die carrier includes the steps of forming a cavity within the substrate having a stepped tier, forming electrically conductive tabs on the stepped tier, forming a plurality of electrically conductive contacts on an underside of the substrate, forming a plurality of electrically conductive external bond terminals disposed on an edge of the substrate or in a recess on the edge of the substrate, forming a plurality of electrically conductive paths from conductive vias and conductive lines in the substrate electrically coupled between the electrically conductive tabs, the electrically conductive contacts, and the electrically conductive external bond terminals.

According to a sixth aspect of the present invention, a method for forming a substrate for a semiconductor die carrier includes the steps of forming electrically conductive tabs surface contacts on an upper surface of the substrate, forming a plurality of electrically conductive contacts on an underside of the substrate, forming a plurality of electrically conductive external bond terminals disposed on an edge of the substrate or in a recess on the edge of the substrate, forming a plurality of electrically conductive paths from conductive vias and conductive lines in the substrate electrically coupled between the electrically conductive surface contacts, the electrically conductive contacts, and the electrically conductive external bond terminals.

Figure 2A:
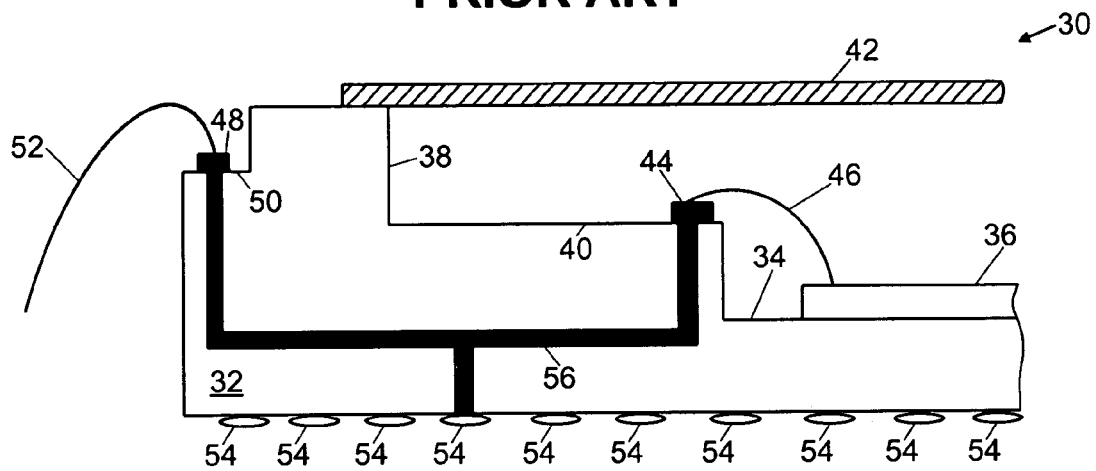
FIG. 2A is a cross section of a first embodiment of a semiconductor die carrier.
Figure 2B:
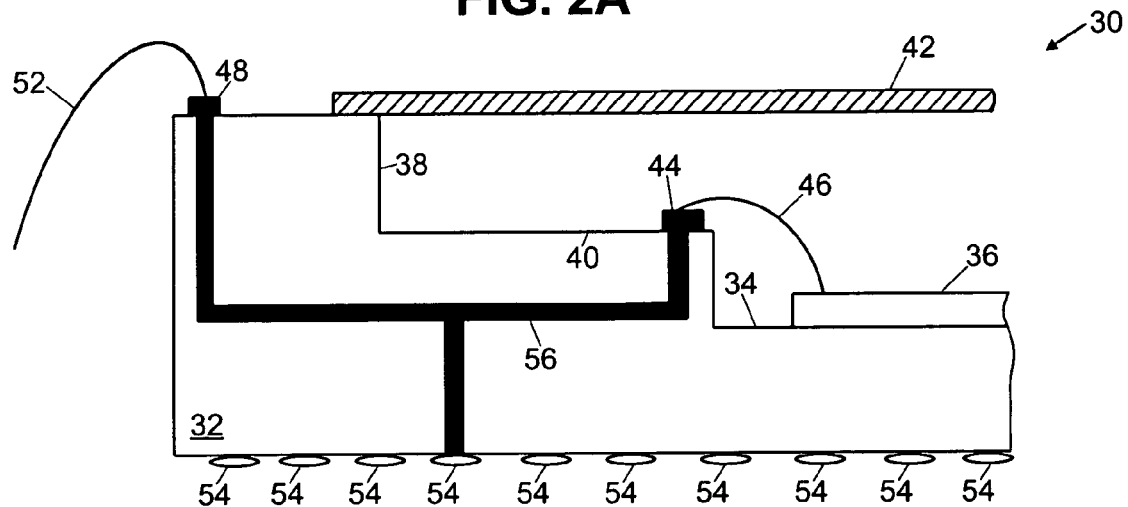
FIG. 2B is a cross section of an alternative embodiment of a semiconductor die carrier illustrated in FIG. 2A.

FIGS. 2A and 2B illustrate schematically in cross-section a first embodiment of a semiconductor die carrier according to the present invention. The die carrier 30 has a substrate 32 formed from a multilayer of ceramic substrates. Other processes for forming the substrate 32 well known to those of ordinary skill in the art such as laminates of organic dielectrics and deposited thin film layers may also be employed according to the present invention.

A cavity is formed in the substrate 32 that has a bottom 34 on which a semiconductor die 36 is disposed and sidewalls 38 in which a stepped tier 40 is formed. The stepped tier 40 has a first or vertical side facing the outer side of the semiconductor die 36, and second or upper side facing the underside of a sealing lid 42, which covers the cavity in which the semiconductor die 36 is disposed. The sealing lid 42 is adhered to the substrate 32 around the top of the cavity in one of several manners well known to those of ordinary skill in the art, and protects the semiconductor die 36 from mechanical, thermal and environmental distress.

Disposed on the upper side of the stepped tier 40 are a plurality of electrically conductive tabs 44. It should be appreciated according to the present invention that stepped tiers in addition to stepped tier 40 upon which electrically conductive tabs are also disposed may be formed in the sidewalls 38 of the substrate 32. Electrical connections are made from the semiconductor die 36 to the plurality of electrically conductive tabs 44 by metal wires 46.

Disposed on an outer edge of the substrate 32 are a plurality of external bond terminals 48. In FIG. 2A, the plurality of external bond terminals 48 are disposed on a ledge 50 in a recess on the outer edge of the die carrier 30. Alternatively, in FIG. 2B, the plurality of external bond terminals 48 are disposed on some portion of the outer edge of the die carrier 30. It should appreciated that the disposition of the external bond terminals 48 on some outer edge of the die carrier 30 includes not only the top of the die carrier 30 as depicted in FIG. 2B, but may also include the side of the die carrier 30 as well. Electrical connections may be made from the external environment to the plurality of external bond terminals 48 by metal wires 52 to provide operating signals for operating the semiconductor die 36 in a normal operating mode. A variety of materials well known to those of ordinary skill in the art, for example Cu and Au, may be employed for the electrically conductive tabs 44, the external bond terminals 48, and the wires 46 and 52.

On the underside of the substrate 32 are a plurality of metal pads 54 arranged in a land grid array. Electrical connections may be made from the external environment to the plurality of metal pads 54 to provide signals for testing and programming the semiconductor die 36 in either a testing or programming mode. A variety of materials well known to those of ordinary skill in the art, for example Cu, W, nickel plating, and gold plating may be employed for the metal pads 54 in the land grid array. The die carrier 30 may be adhered at the plurality of metal pads 54 of the land grid array to a substrate such as a PCB or multichip module by any of several known methods well known to those of ordinary skill in the art, such as by epoxy or with a solder ball or column, typically of a PbSn alloy.

According to the present invention, at least one, and preferably each of the plurality of electrically conductive tabs 44 is electrically coupled to a separate electrically conductive path 56 traversing the substrate 32 that is electrically coupled to one of the plurality of metal pads 54 in the land grid array and also, according to the present invention, to one of the external bond terminals 48. The electrically conductive path 56 may include electrically conductive vias and electrically conductive lines formed in the substrate 32 during manufacture. For purposes of illustration only, the electrically conductive path 56 is depicted entirely within the same cross-section in FIGS. 2A and 2B. In a physical embodiment of the present invention, the electrically conductive path 56 may traverse the substrate 32 as desired.

Alternatively, though not depicted, it should be appreciated that each of the plurality of electrically conductive tabs 44 may separately be electrically coupled to a first electrically conductive path traversing the substrate 32 that is electrically coupled to one of the plurality of metal pads 54 in the land grid array and also, according to the present invention, to a second electrically conductive path, distinct from the first electrically conductive path traversing the substrate, that is electrically coupled to one of the external bond terminals 48. Further, it should be appreciated that some of the electrically conductive tabs 44 may each separately only be electrically coupled by an electrically conductive path traversing the substrate 32 to one of the plurality of metal pads 54 in the land grid array and that others of the electrically conductive tabs 44 may each separately be only electrically coupled by an electrically conductive path traversing the substrate 32 to one of the external bond terminals 48.

In FIGS. 2A and 2B, it should be appreciated that although only a single electrically conductive tab 44, a single metal wire 46, a single external bond terminal 48, a single metal wire 52, and a single electrically conductive path 56 are depicted, that these represent a plurality of electrically conductive tabs 44, a plurality of metal wires 46, a plurality of external bond terminals 48, a plurality of metal wires 52, and a plurality of electrically conductive paths 56.

With the addition of the external bond terminals 48 to the die carrier 30, the plurality of metal pads 54 of the land grid array may be employed to test and, for example in the case of a PLD, program the semiconductor die 36, and then use the external bond terminals 48 to route signals between the semiconductor die 36 and the external environment such as a PCB or multichip module for normal operation. According to the present invention, the Known Good Die process is made more reliable and feasible, because the plurality of metal pads 54 may be examined after programming and/or testing, and in the event the metal pads 54 on the die carrier 30 are damaged, the external bond terminals 48 are available for the normal operation of the semiconductor die 36. It should be appreciated, however, that the metal pads 54 may still be employed to route signals between the external environment and the semiconductor die 36, if desired, when the metal pads 54 are undamaged by the Known Good Die process.

Figure 3A:
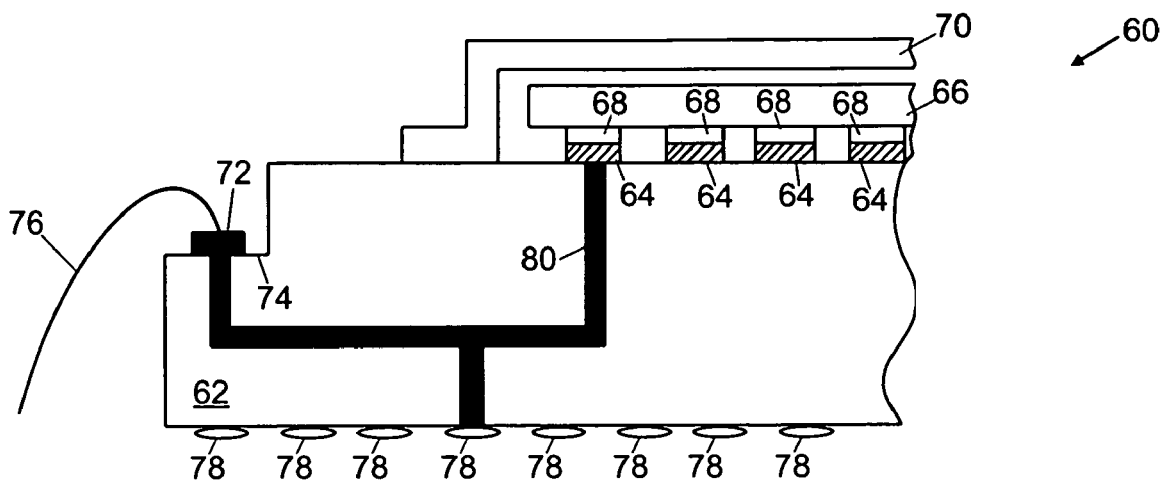
FIG. 3A is a cross section of a second embodiment of a semiconductor die carrier.
Figure 3B:
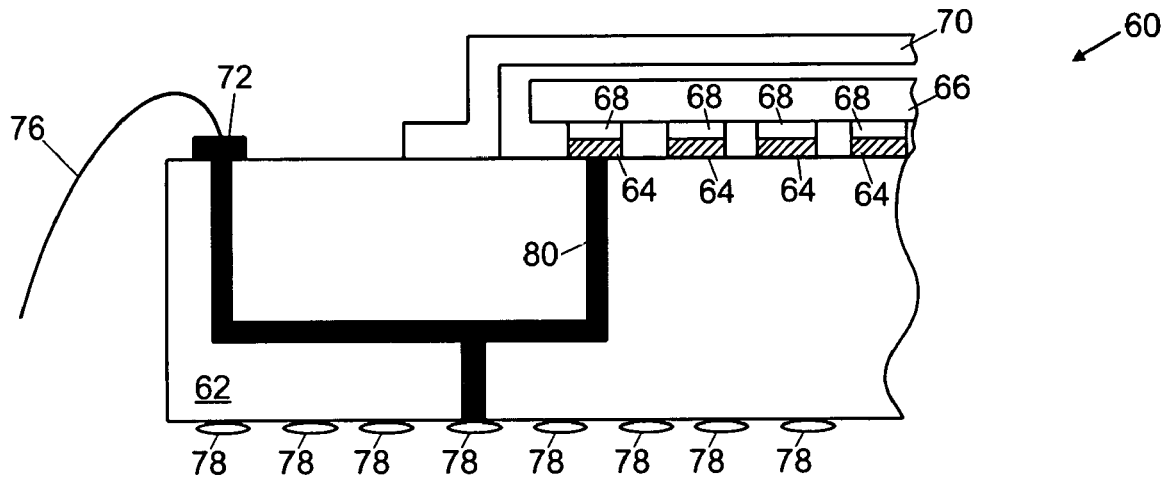
FIG. 3B is a cross section of an alternative embodiment of the semiconductor die carrier illustrated in FIG. 3A.

FIGS. 3A and 3B illustrate schematically in cross-section a second embodiment of a semiconductor die carrier according to the present invention. The die carrier 60 has a substrate 62 formed from a multilayer of ceramic substrates. Other processes for forming the substrate 62 well known to those of ordinary skill in the art such as laminates of organic dielectrics and deposited thin film layers may also be employed according to the present invention.

On an upper side of the substrate 62 are formed a plurality of electrically conductive surface contacts 64. A semiconductor die 66 with a plurality of electrically conductive semiconductor die contacts 68 is disposed on the upper side of the substrate 62 so that the plurality of semiconductor die contacts 68 mate with the plurality of surface contacts 64. The plurality of semiconductor die contacts 68 may be adhered to the surface contacts 64 by any of several known methods well known to those of ordinary skill in the art, such as by epoxy or with a solder ball or column, typically of a PbSn alloy. A cover 70 is disposed over the semiconductor die 66 and adhered to the upper surface of the substrate 62 to protect the semiconductor die 66 from mechanical, thermal and environmental distress.

Disposed on an outer edge of the substrate 62 are a plurality of external bond terminals 72. In FIG. 3A, the plurality of external bond terminals 72 are disposed on a ledge 74 in a recess on the outer edge of the die carrier 60. Alternatively, in FIG. 3B, the plurality of external bond terminals 72 are disposed on some portion of the outer edge of the die carrier 60. It should appreciated that the disposition of the external bond terminals 72 on some outer edge of the die carrier 60 includes not only the top of the die carrier 60 as depicted in FIG. 3B, but may also include the side of the die carrier 60 as well. Electrical connections may be made from the external environment to the plurality of external bond terminals 72 by metal wires 76 to provide operating signals for operating the semiconductor die 66 in a normal operating mode. A variety of materials well known to those of ordinary skill in the art, for example Cu and Au, may be employed for the electrically conductive surface contacts 64, the external bond terminals 72, and the wires 76.

On the underside of the substrate 62 are a plurality of metal pads 78 arranged in a land grid array. Electrical connections may be made from the external environment to the plurality of metal pads 78 to provide signals for testing and programming the semiconductor die 66 in either a testing or programming mode. A variety of materials well known to those of ordinary skill in the art, for example Cu, W, nickel plating, and gold plating may be employed for the metal pads 78 in the land grid array. The die carrier 60 may be adhered at the plurality of metal pads 78 of the land grid array to a substrate such as a PCB or multichip module by any of several known methods well known to those of ordinary skill in the art, such as by epoxy or with a solder ball or column, typically of a PbSn alloy.

According to the present invention, at least one, and preferably each of the plurality of electrically conductive surface contacts 64 is electrically coupled to a separate electrically conductive path 80 traversing the substrate 62 that is electrically coupled to one of the plurality of metal pads 78 in the land grid array and also, according to the present invention, to one of the external bond terminals 72. The electrically conductive path 80 may include electrically conductive vias and electrically conductive lines formed in the substrate 62 during manufacture. For purposes of illustration only, the electrically conductive path 80 is depicted entirely within the same cross-section in FIGS. 3A and 3B. In a physical embodiment of the present invention, the electrically conductive path 80 may traverse the substrate 62 as desired.

Alternatively, though not depicted, it should be appreciated that each of the plurality of electrically conductive surface contacts 64 may separately be electrically coupled to a first electrically conductive path traversing the substrate 62 that is electrically coupled to one of the plurality of metal pads 78 in the land grid array and also, according to the present invention, to a second electrically conductive path, distinct from the first electrically conductive path traversing the substrate, that is electrically coupled to one of the external bond terminals 72. Further, it should be appreciated that some of the electrically conductive surface contacts 64 may each separately be only electrically coupled by an electrically conductive path traversing the substrate 62 to one of the plurality of metal pads 78 in the land grid array and that others of the electrically conductive surface contacts 64 may each separately be only electrically coupled by an electrically conductive path traversing the substrate 64 to one of the external bond terminals 72.

In FIGS. 3A and 3B, it should be appreciated that although only a single external bond terminal 72, a single metal wire 76, and a single electrically conductive path 80 are depicted, that these represent a plurality of external bond terminals 72, a plurality of metal wires 76, and a plurality of electrically conductive paths 80.

With the addition of the external bond terminals 72 to the die carrier 60, the plurality of metal pads 78 of the land grid array may be employed to test and, for example in the case of a PLD, program the semiconductor die 66, and then use the external bond terminals 72 to route signals between the semiconductor die 66 and the external environment such as a PCB or multichip module for normal operation. According to the present invention, the Known Good Die process is made more reliable and feasible, because the plurality of metal pads 78 may be examined after programming and/or testing, and in the event the metal pads 78 on the die carrier 60 are damaged, the external bond terminals 72 are available for the normal operation of the semiconductor die 66. It should be appreciated, however, that the metal pads 78 may still be employed to route signals between the external environment and the semiconductor die 66, if desired, when the metal pads 78 are undamaged by the Known Good Die process.

Figure 4A:
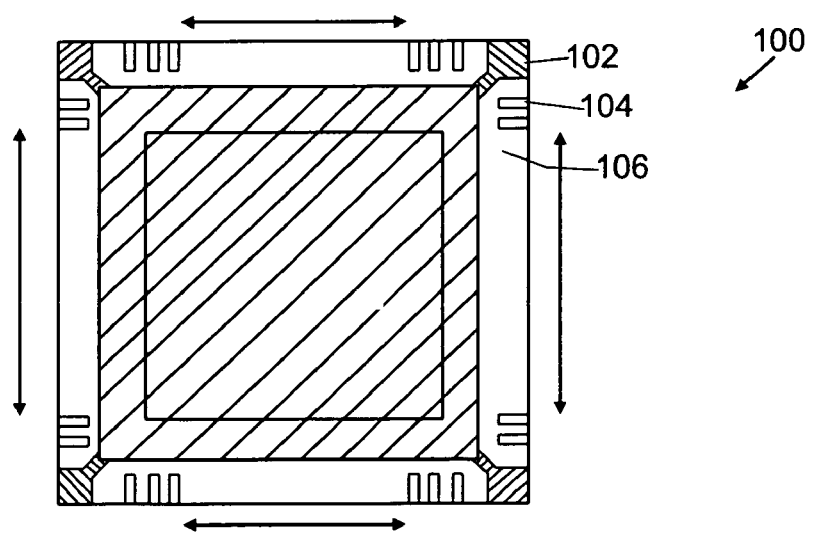
FIG. 4A is a top-down view of a semiconductor die carrier.
Figure 4B:
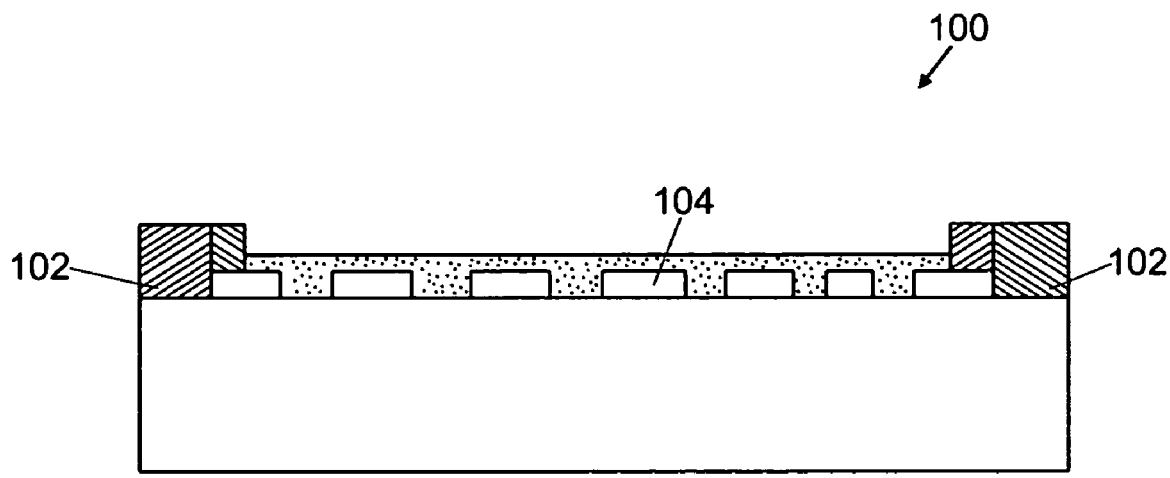
FIG. 4B is a side view of a semiconductor die carrier.

In FIG. 4A a top-down view of the die carrier 100 according to the embodiments of the present invention disclosed with reference to FIGS. 2A and 3A is illustrated. In FIG. 4A, ceramic corner posts 102 are disposed at each of the four corners on the top of the die carrier 100. The corner posts 102 are employed to aid in the alignment of the seal lid 42 in FIG. 2A and the cover 70 in FIG. 3A. On each edge on the top of the die carrier 100, the external bond terminals 104 are disposed on a ledge 106, as at 50 in FIGS. 2A and 74 in FIG. 3A, in a recess formed in the substrate. In FIG. 4B, a side view of the die carrier 100, illustrates according to the present invention corner posts 102 and the external bond terminals 104 disposed in the recess of the substrate.

Methods of manufacture of a die carrier according to the present invention are well known to those of ordinary skill in the art. As an example of such a process of manufacture, a limited description of ceramic die carrier will be made herein.

Figure 5:
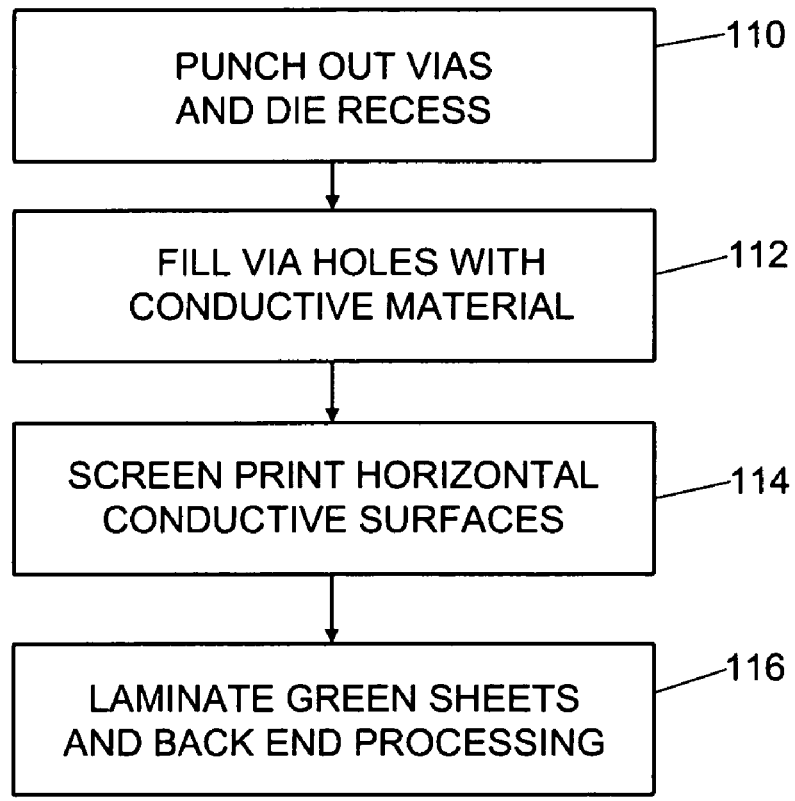
FIG. 5 is a flow diagram describing the process of forming a ceramic semiconductor die carrier.

In FIG. 5, a flow diagram describing the process of forming a ceramic die carrier is set forth. In this process, cut unfired flexible raw ceramic sheets, known to those of ordinary skill in the art as a green sheets, are processed as will be described and then stacked one on top of another and laminated to bond the green sheets together and thereby form the unitary body of the die carrier.

At step 110, a green sheet has a recess for the die carrier and the vias punched out, and at step 112, the via holes are filled with an electrically conductive material.

At step 114, as the die carrier is being built up from bottom to top, the electrically conductive materials which are disposed horizontally in the die carrier are screen printed as desired on the upper surface of the green sheets. The horizontally disposed electrically conductive materials include the electrically conductive tabs disposed on the first and second tiers, the external bond terminals disposed either in recesses on the lateral edges of the die carrier or on the lateral edges of the top of the die carrier and the electrical lines connecting the electrically conductive tabs to the external bond terminals.

At step 116, after the green sheets have been laminated, back end processing steps occur which include shaping, cofiring, nickel plating, metal pad assembly, brazing, finish plating, snap breaking and edge grinding. Each of these steps and others well known to those of ordinary skill in the art will not be described herein to avoid overcomplicating the disclosure and thereby obscure the present invention.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a substrate for a semiconductor die carrier, the semiconductor die carrier having an external environment, said method including steps of:
   forming a cavity within the substrate having a stepped tier;
   forming electrically conductive tabs on said stepped tier;
   forming a plurality of electrically conductive contacts on an underside of the substrate;
   forming a plurality of electrically conductive external bond terminals disposed on an edge of the substrate;
   forming a plurality of electrically conductive paths in the substrate electrically coupled between said electrically conductive tabs, said electrically conductive contacts, and said electrically conductive external bond terminals; and
   forming a connection from at least one of said plurality of electrically conductive external bond terminals to the external environment using a metal wire.

2. A method as in claim 1, wherein the step of forming a plurality of electrically conductive external bond terminals disposed on an edge of the substrate further includes the step of:
   forming a recess in said edge of the substrate on which said plurality of electrically conductive external bond terminals are disposed.

3. A method as in claim 1, wherein the step of forming a plurality of electrically conductive paths in the substrate further includes the steps of:
   forming conductive vias in the substrate; and
   forming conductive lines in the substrate.

4. A method for forming a substrate for a semiconductor die carrier, the semiconductor die carrier having an external environment, said method including steps of:
   forming electrically conductive tabs surface contacts on an upper surface of the substrate;
   forming a plurality of electrically conductive contacts on an underside of the substrate;
   forming a plurality of electrically conductive external bond terminals disposed on an edge of the substrate; and
   forming a plurality of electrically conductive paths in the substrate electrically coupled between said electrically conductive surface contacts, said electrically conductive contacts, and said electrically conductive external bond terminals; and
   forming a connection from at least one of said plurality of electrically conductive external bond terminals to the external environment using a metal wire.

5. A method as in claim 4, wherein the step of forming a plurality of electrically conductive external bond terminals disposed on an edge of the substrate further includes the step of:
   forming a recess in said edge of the substrate on which said plurality of electrically conductive external bond terminals are disposed.

6. A method as in claim 4, wherein the step of forming a plurality of electrically conductive paths in the substrate further includes the steps of:
   forming conductive vias in the substrate; and
   forming conductive lines in the substrate.

* * * * *